United States Patent [19]

Lee et al.

[11] 4,430,311

[45] Feb. 7, 1984

[54] ALUMINA COMPOUNDS IN ION EXCHANGE RESINS

[75] Inventors: John M. Lee; William C. Bauman, both of Lake Jackson, Tex.

[73] Assignee: The Dow Chemical Co., Midland, Mich.

[21] Appl. No.: 487,540

[22] Filed: Apr. 22, 1983

Related U.S. Application Data

[62] Division of Ser. No. 95,681, Nov. 19, 1979, Pat. No. 4,381,349.

[51] Int. Cl.$^3$ .................... B01J 41/00; B01J 41/12
[52] U.S. Cl. ....................... 423/179.5; 423/181; 423/465; 521/28; 521/31
[58] Field of Search ............... 423/179.5, 187; 521/28

[56] References Cited

U.S. PATENT DOCUMENTS 4,348,296 9/1982 Bauman et al. ................. 521/28
4,376,100 3/1983 Lee et al. ....................... 423/179.5

*Primary Examiner*—Joseph L. Schofer
*Assistant Examiner*—Peter F. Kulkosky
*Attorney, Agent, or Firm*—W. J. Lee

[57] ABSTRACT

Formation of hydrous alumina in the reticules of a weak-base anion exchange resin, wherein $AlCl_3$ has been precipitated as hydrous alumina by reaction with ammonia, is improved by employing a subsequent treatment with HCl or with $NH_4Cl$ and HCl to convert the exchange resin to the chloride form, thereby increasing the reticular volume of the resin, thus permitting subsequent precipitation of additional hydrous alumina therein.

12 Claims, No Drawings

ALUMINA COMPOUNDS IN ION EXCHANGE RESINS

CROSS-REFERENCE TO RELATED APPLICATION

This is a divisional, of application Ser. No. 095,681, filed Nov. 19, 1979 now U.S. Pat. No. 4,381,349.

BACKGROUND OF THE INVENTION

We have obtained U.S. Pat. Nos. 4,116,858; 4,116,856; and 4,159,311 which pertain to the formation of hydrous alumina within a particulate anion exchange resin; the hydrous alumina is shown to be reacted with LiCl to form crystalline $LiCl.2Al(OH)_3$ or reacted with LiOH to form crystalline $LiOH.2Al(OH)_3$. The hydrous alumina is shown to be prepared by the ammonia precipitation of $AlCl_3$ dispersed in the anion exchange resin.

SUMMARY OF THE INVENTION

Formation of hydrous alumina dispersed within a weak-base anion exchange resin (formed by ammonia precipitation of $AlCl_3$ in the resin) is improved by treatment of the resin (containing the hydrous alumina) with aqueous HCl or $NH_4Cl$ and HCL at slightly acid conditions, thereby converting the resin to the $Cl^-$ form, thus permitting the subsequent precipitation of additional hydrous alumina therein.

As used herein, the term "weak-base" refers to anion exchange resins wherein salt forms of the functional amine groups are converted to the $OH^-$ form by $NH_4OH$.

DETAILED DESCRIPTION OF THE INVENTION

Our U.S. Pat. Nos. 4,116,858; 4,116,856; and 4,159,311 are incorporated herein by reference.

The patents disclose anion exchange resins of the weak-base or strong-base varieties and disclose that the neutral halide salt forms of the strong-base resins may be used as the starting material. During the process of precipitating hydrous alumina in the resin by the ammonia precipitation of $AlCl_3$, the halide salt forms of weak-base anion exchange resins are converted to the $OH^-$ form. Anion exchange resins can have functional amine groups which are substantially all of the weak-base variety, some which are substantially all of the strong-base variety, and some which contain both varieties. This disclosure deals with anion exchange resins which contain any groups of the weak-base variety as the term "weak-base" is defined above.

We have found that the amount of hydrous alumina which may be incorporated into the resin by the ammonia precipitation of Al halide is limited in any one step by the maximum solubility of Al halide and the free volume in the resin. The ammonia treatment also converts the weak-base resin to the $OH^-$ form, which is approximately only 80% of the volume of the halide form and thus there is less volume available to imbibe more Al halide solution. We have discovered that the resulting $OH^-$ form of the resin, already containing substantially all the hydrous alumina that can be dispersed within the said $OH^-$ form, can be treated with acid halide at a slightly acid pH of not lower than about 5, thereby converting the $OH^-$ form to the halide form of the resin, without solubilizing the $Al(OH)_3$ in the resin; this permits additional amounts of Al halide to be imbibed and then converted, by ammonia treatment, to additional amounts of $Al(OH)_3$. The preferred acid halide is HCl. The preferred Al halide is $AlCl_3$.

The acid halide treatment of the $Al(OH)_3$-containing $OH^-$ resin should be done carefully, taking care that the acid addition is not so rapid that a localized drop in pH to lower than about 5 is reached. Slow addition of acid, with stirring and while monitoring the pH, is recommended. Any convenient method for lowering the pH, by addition of acid halide, may be used so long as the method does not result in solubilizing a substantial amount of the $Al(OH)_3$ which is already in the resin. Converting the $Al(OH)_3$ back to Al halide would be counterproductive, considering that the intent is to form $Al(OH)_3$ in the resin.

The acid halide treatment step is beneficially aided and speeded by the addition of ammonium halide, especially $NH_4Cl$. The amount of $NH_4Cl$ added may be over a fairly broad range, with about 5-25% aqueous strength of $NH_4Cl$ being particularly beneficial. Other amine hydrochlorides may be used, but $NH_4Cl$ is preferred. The ammonium halide acts as a buffer against localized over-acidification during the acid halide addition, thereby allowing faster addition of the acid halide. The ammonium halide added initially, prior to the acid halide addition, may be mostly removed when the resin is drained before addition of more Al halide. Then when $NH_4OH$ is added to convert Al halide to $Al(OH)_3$, more ammonium halide is formed.

HCl is the most appropriate acid to use if one intends to convert the hydrous alumina, $Al(OH)_3$, to $LiCl.2Al(OH)_3$. However, if one intends to convert to $LiX.2Al(OH)_3$, where X is a different halogen than chlorine, then it is recommended that the corresponding acid halide be used and that the corresponding ammonium halide be used, thus avoiding a mixture of halo compounds.

The temperature for use with the HCl or the $NH_4Cl/HCl$ treatment should be in the range of about 20° C. to about 100° C., preferably about 45° C. to about 100° C. If higher temperatures are desired so as to speed the treatment, superatmospheric pressures may be needed to avoid substantial loss of ingredients through vaporization.

It appears that the HCl or $NH_4Cl/HCl$ treatment swells the resin, thereby permitting further sequential treatment steps, thus providing for appreciable increases in the aluminum content of the resin. As much as a three-fold increase or more in the Al content of the resin is readily attained. By this increase in the Al content in the resin (first as hydrous alumina and then as $LiX.2Al(OH)_3$), the composite has greater capacity for recovering $Li^+$ values from brines or other aqueous $Li^+$ solutions and a more efficient $Li^+$ recover process is attained. The higher loading of aluminate in the resin permits greater concentration of LiX in the effluent of the exchange column when recovering $Li^+$ from brines or other aqueous $Li^+$ solutions.

We have also found that the formation of crystalline $LiX.2Al(OH)_3$, formed by heating LiX (where X is $Cl^-$ or $OH^-$) within the resin/$Al(OH)_3$ composite, is enhanced by performing the heating at high pH of, say, about 11 to about 11.5 which is done in a metal (non-glass) container to avoid heating the highly alkaline mixture in glass. Heating of highly alkaline mixtures in glass can result in minute amounts of lithium silicate which can interfere to some extent with the formation of highly crystalline LiX.2Al(OH)$_3$.

The following examples are to illustrate certain embodiments, but the invention is not limited to the embodiments shown.

For purposes of comparison, the same resin (DOWEX ® MWA-1 anion exchange resin) is employed in each of the following examples. The DOWEX ® resin (a tradename of The Dow Chemical Company) is a particulate, macroporous anion exchange resin comprising a styrene-divinylbenzene cross-linked polymer having pendant tertiary amine groups.

EXAMPLE 1

A portion of the resin is flooded with a concentrated aqueous solution of AlCl$_3$, dried to free flowing, and then treated with NH$_4$OH to cause precipitation of Al(OH)$_3$ dispersed within the resin. Extraneous NH$_4$Cl, NH$_4$OH and Al(OH)$_3$ are washed out, leaving the resin (in OH$^-$ form) containing the Al(OH)$_3$ dispersed therein. At this point the resin contains about 1.1 millimole per cubic centimeter of Al per cc of dry resin in the base form.

The resin preparation in the dried form is screened and 223.58 g of −30 mesh beads are further treated in the following manner: Enough water is added to make a slurry, which is stirred from above with a Waco motor paddle blade stirrer. About 40 g of NH$_4$Cl is stirred into the slurry; the temperature is raised to about 80°–95° C. and 750 meq. of HCl is slowly added, during which the pH is not permitted to go lower than pH 5.

After all the acid is in, the pH is a stable pH 5.2. Yield is 645 ml of resin. After the product is well washed with water and drained dry to 460.3 g, a saturated solution of AlCl$_3$ (200 cc) is added to the resin with stirring, then 20 g of AlCl$_3$ additional is added. After the exotherm begins to subside, the resin is filtered. The filtrate has a specific gravity of 1.28. The product resin is dried in a dry nitrogen stream to a weight of 476.8 g. The dried material is slurried in 380 cc of 30% aqueous NH$_3$ (exotherms). After stirring for one-half hour the solids are washed well by decanting the Al(OH)$_3$ which forms outside of the resin. The washed resin is re-slurried in water and heated. Again NH$_4$Cl and 720 meq. of HCl are added to again attain slight acidity not lower than pH 5. The washed resin volume is 640 cc. after drying back to 507.3 g; 250 cc of saturated AlCl$_3$ solution and 83 g of anhydrous AlCl$_3$ are stirred with the resin, then allowed to stand overnight.

The resin is filtered to a weight of 563.3 g and the damp-dry resin slurried in 380 cc of 30% NH$_3$ aqueous. After washing, the volume of product is now 580 cc.

About 500 cc of the resin are then added to excess 35% AlCl$_3$ solution, slurried, then filtered and dried in a N$_2$ stream to 446.8 g. The dry resin then is slurried in 300 ml of 30% aqueous NH$_3$. After washing thoroughly to remove external Al(OH)$_3$ the resin volume is 450 ml. Each ml contains about 3.33 millimole of Al.

Fifty grams of LiCl and saturated NaCl brine (low Ca and Mg) are added to volume of 750 ml., warmed to 68° C. and pH 7.75 is read. After cooling 20 hours, the slurry is heated to boiling and 250 meq. NaOH added slowly to pH 8.5. The resin/LiX.2Al(OH)$_3$ composite is filtered and put in a metal beaker at 95° C. in the oven for 24 hours. Then 40 g NH$_4$Cl are added and heated with stirring as 722 meq. of HCl are added to give pH 5 at 90° C. Al content is now about 3.1 millimole per cubic centimeter of resin. Yield is 470 cc of resin composite.

A 118 cc sample of the resin is tested in a temperature controlled, jacketed column. A lithium-containing brine from Arkansas is passed through at 20 cc per min. and 90° C. until the effluent is the same as the influent with respect to Li$^+$. Water containing 60 ppm Li$^+$ is passed through at 3.08 cc per min. and 90° C. and the effluent collected. The first cut is 50 cc; all others 10 cc. The analysis by flame photometer shows in milligrams of Li$^+$ per liter:

| Cut | | |
|---|---|---|
| 4 | 740 | |
| 5 | 5000 | (taking #5, 6, 7, the average LiCl content is 3.97%, or about 20 times the loading brine) |
| 6 | 7650 | |
| 7 | 6800 | |
| 8 | 3266 | |
| 9 | 2450 | |

EXAMPLE 2

Substantially in accordance with the method employed in Example 1 above, it is found that multiple precipitations of Al(OH)$_3$ in the anion exchange resin, prior to reaction with LiCl to form crystalline LiCl.2Al(OH)$_3$, is beneficial in giving increased strength of Li$^+$ in the effluent from the Li$^+$ recovery process than is a single precipitation such as is shown by the issued patents identified supra. Data are shown below:

| Precipititions of Al(OH)$_3$ | Al loading in resin mmole Al/cc resin | Conc. Li$^+$ in Effluent Mg Li$^+$/liter (peak) |
|---|---|---|
| single* | ~1.2 | 3000 |
| multiple | 2.0 | 4000 |
| multiple | 3.0 | 5200 |
| multiple | 4.0 | 6200 |

*For comparison purposes with prior patents.

It is within the purview of the present invention that the Li$^+$-containing solution (from which Li$^+$ values may be recovered) be a natural or synthetic brine or an aqueous solution from an ore-dressing or ore-treatment operation.

We claim:

1. In a process for recovering Li$^+$ from brine by the use of a composite comprising an ion exchange resin having dispersed therein crystalline LiX.2Al(OH)$_3$, where X is halide, the improvement which comprises the use of a composite prepared by:
   precipitating Al(OH)$_3$ in the reticules of a weak-base anion exchange resin by the in-situ ammonia precipitation of Al halide in aqueous media, thereby forming a composite of anion exchange resin having Al(OH)$_3$ dispersed therein, followed by the additional steps of
   (a) slightly acidifying the so-formed composite in an aqueous medium with HX, X being halide, where the amount of HX is an amount sufficient to provide an acid pH of not lower than about 5.0, thereby converting the anion exchange resin to the halide salt form,
   (b) subtantially separating the composite from the aqueous portion,
   (c) substantially flooding the composite with an aqueous solution of Al halide, draining the excess solution, (d) adding NH₄OH to precipitate additional Al(OH)₃ in the resin, and (e) reacting with a Li compound at elevated temperature to form crystalline LiX.2Al(OH)₃ dispersed in the resin.

2. The process of claim 1 wherein ammonium halide is employed along with the HX during the acidifying step.

3. The process of claim 1 wherein ammonium halide, in an amount of about 5% to about 25% of the aqueous portion is employed along with the HX during the acidifying step.

4. The process of claim 1 wherein the steps (a) through (d) are repeated one or more times.

5. The process of claim 1 wherein each halide is chloride.

6. The process of claim 1 wherein the acidifying step is performed in the temperature range of about 20° C. to about 100° C.

7. The process of claim 1 wherein the acidifying step is performed in the temperature range of about 45° C. to about 100° C.

8. The process of claim 1 wherein step (e) comprises reacting, in aqueous media at elevated temperature, the so-formed composite of resin and Al(OH)₃ with LiOH and/or LiX, where X is halogen, to convert the Al(OH)₃ to crystalline LiOH.2Al(OH)₃ and/or LiX.2Al(OH)₃, thereafter contacting with acidic LiX to convert any crystalline LiOH.2Al(OH)₃ to crystalline LiX.2Al(OH)₃.

9. In the process for recovering Li⁺ from brine by the use of a composite comprising an ion exchange resin having dispersed therein crystalline LiCl.2Al(OH)₃, the improvement which comprises the use of a composite prepared by:

precipitating Al(OH)₃ in the reticules of a weak-base anion exchange resin by the in-situ ammonia precipitation of AlCl₃ in aqueous solution, thereby forming a composite of anion exchange resin having Al(OH)₃ dispersed therein, followed by the additional steps of (a) acidifying the so-formed composite in an aqueous medium with HCl to a pH of not lower than about 5.0, at a temperature in the range of about 20° C. to 100° C., thereby converting the anion exchange resin to the chloride salt form, (b) substantially separating the composite from the aqueous portion, (c) substantially flooding the composite with an aqueous solution of AlCl₃, draining the excess solution, (d) adding NH₄OH to precipitate additional Al(OH)₃ in the resin, (e) repeating steps (a) through (d) one or more times, and (f) reacting the so-formed composite, in aqueous media at elevated temperature, with LiOH and/or LiCl to convert the Al(OH)₃ to crystalline LiOH.2Al(OH)₃ and/or LiCl.2Al(OH)₃, thereafter contacting with acidic LiCl to convert any crystalline LiOH.2Al(OH)₃ to crystalline LiCl.2Al(OH)₃.

10. The process of claim 9 wherein ammonium chloride is employed along with the HCl during the acidifying step.

11. The process of claim 9 wherein ammonium chloride in an amount of about 5% to about 25% of the aqueous portion is employed along with the HCl during the acidifying step.

12. The process of claim 9 wherein the acidifying step is performed at a temperature in the range of about 45° C. to about 100° C.

* * * * *

UNITED STATES PATENT AND TRADEMARK OFFICE
CERTIFICATE OF CORRECTION

PATENT NO. : 4,430,311

DATED : February 7, 1984

INVENTOR(S) : John M. Lee and William C. Bauman

It is certified that error appears in the above—identified patent and that said Letters Patent is hereby corrected as shown below:

Col. 4, line 33 "Precipititions" should be --Precipitations--.
Col. 4, line 64 "subtantially" should be --substantially--.
Col. 5, line 31 first occurance of "the" should be --a--.

Signed and Sealed this

Twelfth Day of June 1984

[SEAL]

Attest:

GERALD J. MOSSINGHOFF

Attesting Officer

Commissioner of Patents and Trademarks